(12) United States Patent
Soda et al.

(10) Patent No.: US 8,796,349 B2
(45) Date of Patent: Aug. 5, 2014

(54) PHOTOSENSITIVE RESIN COMPOSITION FOR MICROLENSES

(75) Inventors: Hiroyuki Soda, Funabashi (JP); Takahiro Sakaguchi, Funabashi (JP); Takahiro Kishioka, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 13/989,185

(22) PCT Filed: Nov. 21, 2011

(86) PCT No.: PCT/JP2011/076812
§ 371 (c)(1),
(2), (4) Date: May 23, 2013

(87) PCT Pub. No.: WO2012/073742
PCT Pub. Date: Jun. 7, 2012

(65) Prior Publication Data
US 2013/0245152 A1    Sep. 19, 2013

(30) Foreign Application Priority Data

Nov. 30, 2010   (JP) ................................ 2010-266469

(51) Int. Cl.
| | |
|---|---|
| C08G 61/12 | (2006.01) |
| C08F 2/46 | (2006.01) |
| C08G 61/04 | (2006.01) |
| G03F 7/023 | (2006.01) |
| G02B 1/04 | (2006.01) |
| G03F 7/40 | (2006.01) |

(52) U.S. Cl.
CPC .............. *G02B 1/041* (2013.01); *G03T 7/0005* (2013.01); *G03F 7/0233* (2013.01); *G03F 7/40* (2013.01)
USPC .................... 522/167; 522/1; 520/1

(58) Field of Classification Search
USPC .......................................... 522/167, 1; 520/1
See application file for complete search history.

(56) References Cited

U.S. PATENT DOCUMENTS

| | | | |
|---|---|---|---|
| 6,586,560 B1 | 7/2003 | Chen et al. | |
| 2010/0096663 A1* | 4/2010 | Negi et al. ................ | 257/100 |

FOREIGN PATENT DOCUMENTS

| | | | |
|---|---|---|---|
| EP | 0 140 273 A2 | 5/1985 | |
| JP | B2-6-23842 | 3/1994 | |
| JP | A-2001-354822 | 12/2001 | |
| JP | A-2002-323771 | 11/2002 | |
| JP | A-2003-131375 | 5/2003 | |
| JP | 2004-224894 | * 8/2004 | |
| JP | A-2004-224894 | 8/2004 | |
| JP | A-2008-303315 | 12/2008 | |
| JP | A-2009-519991 | 5/2009 | |
| JP | 2010-262150 | * 11/2010 | |
| WO | WO 02/083764 A1 | 10/2002 | |
| WO | WO 2008/143095 | * 11/2008 | |
| WO | WO 2008/143095 A1 | 11/2008 | |

OTHER PUBLICATIONS

Kiguchi et al, JP 2010-262150 Machine Translation.*
Feb. 21, 2012 International Search Report issued in International Patent Application No. PCT/JP2011/076812.
Feb. 21, 2012 Written Opinion issued in International Patent Application No. PCT/JP2011/076812.

* cited by examiner

*Primary Examiner* — Ling Choi
*Assistant Examiner* — Jessica E Whiteley
(74) *Attorney, Agent, or Firm* — Oliff PLC

(57) ABSTRACT

There is provided a photosensitive resin composition for microlenses. A photosensitive resin composition for microlenses including a component (A), a component (B) and a solvent. The component (A): a copolymer having a maleimide structural unit of Formula (1) and a repeating structural unit of Formula (2). The component (B): a photosensitizer

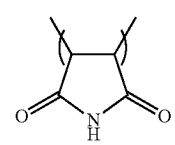

(1)

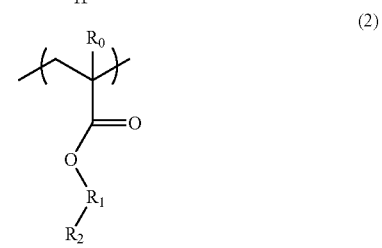

(2)

(in Formula (2), $R_0$ is a hydrogen atom or a methyl group; $R_1$ is a single bond or a $C_{1-5}$ alkylene group; $R_2$ is a thermally cross-linkable monovalent organic group; and in the repeating structural unit of Formula (2), $R_0$s are optionally different from each other).

8 Claims, No Drawings

PHOTOSENSITIVE RESIN COMPOSITION FOR MICROLENSES

TECHNICAL FIELD

The present invention relates to a photosensitive resin composition for microlenses. More specifically, the present invention relates to a photosensitive resin composition for microlenses capable of markedly improving transparency, heat resistance, heat discoloration resistance, and solvent resistance.

BACKGROUND ART

A conventionally known material for forming microlenses is polyhydroxystyrene. However, there is a room for improvement in the polyhydroxystyrene due to the following disadvantages. Microlenses containing the polyhydroxystyrene as the forming material are readily colored by heat at high temperature and are likely to have impaired transparency, and thus coloring of such microlenses may be recognized when they are used.

In the meantime, a photoresist composition, an anti-reflective coating-forming composition, and a resist protective film-forming material for immersion lithography containing a maleimide-based copolymer, and the like have been proposed (Patent Documents 1 to 4).

In order to develop an insulating film for display devices such as a liquid crystal display (LCD) and an organic electroluminescent display device, a method for forming an insulating film for display devices which is characterized by using a radiation-sensitive resin composition that includes an alkali-soluble copolymer of indene, maleimide, and N-substituted maleimide, a 1,2-naphthoquinone diazide compound, and a cross-linking agent has been proposed (Patent Document 5).

A maleimide copolymer having very excellent compatibility with polyfunctional(meth)acrylate and good alkali solubility has been developed in order to be suitably used for various applications requiring such properties. The maleimide-based copolymer is characterized by including a monomer structural unit derived from unsubstituted maleimides, a monomer structural unit derived from styrenes, and a monomer structure derived from (meth)acrylic acids (Patent Document 6).

However, these related art documents have no object to provide an application for a photosensitive resin composition for microlenses and suggest no specific means for and advantageous effects on the application of a copolymer having an unsubstituted maleimide structural unit and a structural unit including an epoxy group or a blocked isocyanate group to a photosensitive resin composition for microlenses.

A radiation-sensitive resin composition has been reported and is characterized by including [A] a polymer of (a1) an unsaturated carboxylic acid and/or an unsaturated carboxylic acid anhydride, (a2) an epoxy group-containing unsaturated compound, (a3) a maleimide-based monomer, and (a4) other olefinic unsaturated compounds and [B] a 1,2-quinonediazide compound (Patent Document 7). The document reporting the radiation-sensitive resin composition describes that the composition achieves high radiation-sensitivity and can readily form a patterned thin film excellent in solvent resistance, heat resistance, transparency, and heat discoloration resistance, but does not suggest the shape and the heat resistance of a pattern formed of the composition. Moreover, there is no description on an unsubstituted maleimide as the maleimide-based monomer.

PRIOR ART DOCUMENTS

Patent Documents

Patent Document 1: U.S. Pat. No. 6,586,560 (B1) specification
Patent Document 2: Japanese Examined Patent Application Publication No. 6-23842 (JP 6-23842 B)
Patent Document 3: Japanese Patent Application Publication No. 2008-303315 (JP 2008-303315 A)
Patent Document 4: Japanese Patent Application Publication No. 2002-323771 (JP 2002-323771 A)
Patent Document 5: Japanese Patent Application Publication No. 2003-131375 (JP 2003-131375 A)
Patent Document 6: Japanese Patent Application Publication No. 2004-224894 (JP 2004-224894 A)
Patent Document 7: Japanese Patent Application Publication No. 2001-354822 (JP 2001-354822 A)

SUMMARY OF THE INVENTION

Problem to be Solved by the Invention

In view of the above, it is an object of the present invention to provide a photosensitive resin composition for microlenses capable of markedly improving transparency, heat resistance, heat discoloration resistance, solvent resistance, and patterning properties.

Means for Solving the Problem

As a result of intensive studies for solving the problems, the inventors of the present invention have completed the present invention.

That is, as a first aspect, a photosensitive resin composition for microlenses includes a component (A), a component (B), and a solvent. The component (A) is a copolymer including a maleimide structural unit of Formula (1) and a repeating structural unit of Formula (2). The component (B) is a photosensitizer.

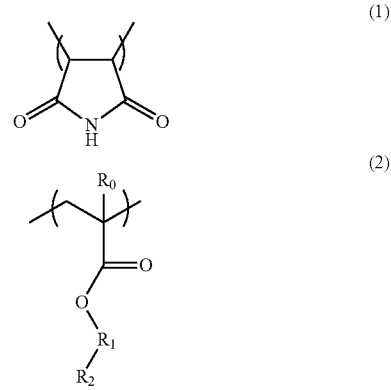

(In Formula (2), $R_0$ is a hydrogen atom or a methyl group, $R_1$ is a single bond or a $C_{1-5}$ alkylene group, and $R_2$ is a thermally cross-linkable monovalent organic group; and in the repeating structural unit of Formula (2), $R_0$s are optionally different from each other.)

As a second aspect, the photosensitive resin composition for microlenses according to the first aspect in which the thermally cross-linkable monovalent organic group is characterized by including an epoxy group or a blocked isocyanate group.

As a third aspect, the photosensitive resin composition for microlenses according to the first aspect or the second aspect in which the component (A) is a copolymer further including at least one of three repeating structural units of Formula (3), Formula (4), and Formula (5).

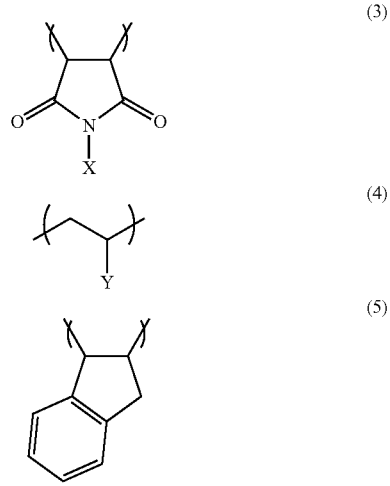

(In Formula (3), X is a $C_{1-5}$ alkyl group, a $C_{5-6}$ cycloalkyl group, a phenyl group, or a benzyl group; and in the alkyl group, the cycloalkyl group, the phenyl group, and the benzyl group, some or all hydrogen atoms are optionally substituted by a halogen atom, a carboxy group, a hydroxy group, an amino group, or a nitro group.)

(In Formula (4), Y is a phenyl group, a naphthyl group, an anthracenyl group, a biphenylyl group, or a $C_{1-8}$ alkoxy group; and in the phenyl group, the naphthyl group, the anthracenyl group, and the biphenylyl group, some or all hydrogen atoms are optionally substituted by a $C_{1-10}$ alkyl group, a halogen atom, a carboxy group, a hydroxy group, an amino group, or a nitro group)

As a fourth aspect, the photosensitive resin composition for microlenses according to any one of the first aspect to the third aspect further includes a cross-linking agent as a component (C).

As a fifth aspect, the photosensitive resin composition for microlenses according to any one of the first aspect to the fourth aspect in which the copolymer has a weight average molecular weight of 1,000 to 50,000.

As a sixth aspect, a cured film is obtained from the photosensitive resin composition for microlenses according to any one of the first aspect to the fifth aspect.

As a seventh aspect, a microlens is produced from the photosensitive resin composition for microlenses according to any one of the first aspect to the fifth aspect.

Effects of the Invention

A film formed of a photosensitive resin composition for microlenses of the present invention can have excellent transparency, heat resistance, heat discoloration resistance, and solvent resistance.

A pattern formed of the photosensitive resin composition for microlenses of the present invention can also have excellent heat resistance.

From the above, a film formed of the photosensitive resin composition for microlenses of the present invention can markedly reduce the possibility of coloring of microlenses and deformation of a lens shape by heat treatment at a high temperature during a process of forming the film or a process of forming a peripheral device, for example, wiring. The photosensitive resin composition can also markedly suppress disadvantages such as the deformation and the exfoliation of microlenses by an organic solvent when the microlenses are subjected to processes of forming an electrode and wiring after the formation of the microlenses.

Therefore, the photosensitive resin composition for microlenses of the present invention is suitable for the material for forming microlenses.

MODES FOR CARRYING OUT THE INVENTION

The present invention is a photosensitive resin composition for microlenses including a component (A) of a copolymer having a maleimide structural unit and a repeating structural unit bonded with a thermally cross-linkable monovalent organic group, a component (B) of a photosensitizer, and a solvent.

Each component will be described hereinafter in detail.

The solid content that is the content of components except solvents in the photosensitive resin composition for microlenses of the present invention is typically 1 to 50% by mass.

<Component (A)>

The component (A) of the present invention is a copolymer having a maleimide structural unit of Formula (1) and a repeating structural unit of Formula (2).

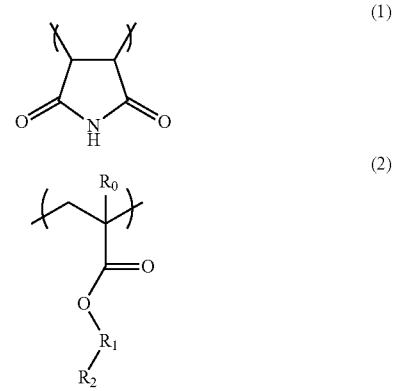

(in Formula (2), $R_0$ is a hydrogen atom or a methyl group, $R_1$ is a single bond or a $C_{1-5}$ alkylene group, and $R_2$ is a thermally cross-linkable monovalent organic group. In the repeating structural unit of Formula (2), $R_0$s may be different from each other)

The thermally cross-linkable monovalent organic group $R_2$ preferably includes an epoxy group or a blocked isocyanate group. $R_2$ is more preferably an organic group including an epoxy group, which can suppress, for example, film shrinkage caused by heat treatment.

The organic group including an epoxy group may include a non-alicyclic structure or an alicyclic structure. Specific examples of the repeating structural unit of Formula (2) in which $R_2$ is an organic group including an epoxy group include a repeating structural unit of Formula (6) when the organic group including an epoxy group has a non-alicyclic structure and a repeating structural unit of Formula (7) when the organic group including an epoxy group has an alicyclic structure.

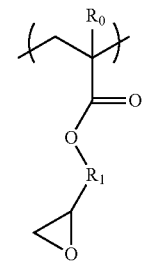
(6)

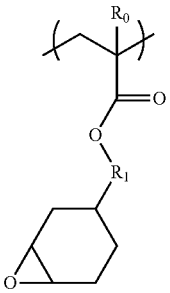
(7)

(In Formula (6) and Formula (7), each $R_0$ is independently a hydrogen atom or a methyl group and each $R_1$ is independently a single bond or a $C_{1-5}$ alkylene group. $R_0$ is preferably a methyl group and $R_1$ is preferably a methylene group.)

The blocked isocyanate group is a compound in which an isocyanate group (—N=C=O) is blocked with an appropriate protective group. Examples of the blocking agent include alcohols such as methanol, ethanol, isopropanol, n-butanol, 2-ethoxyhexanol, 2-N,N-dimethylaminoethanol, 2-ethoxyethanol, and cyclohexanol; phenols such as phenol, o-nitrophenol, p-chlorophenol, o-cresol, m-cresol, and p-cresol; lactams such as ε-caprolactam; oximes such as acetone oxime, methyl ethyl ketone oxime, methyl isobutyl ketone oxime, cyclohexanone oxime, acetophenone oxime, and benzophenone oxime; pyrazoles such as pyrazole, 3,5-dimethylpyrazole, and 3-methylpyrazole; and thiols such as dodecanethiol and benzenethiol.

Specific examples of the repeating structural unit of Formula (2) in which $R_2$ is an organic group including a blocked isocyanate group include a repeating structural unit of Formula (8) and a repeating structural unit of Formula (9). From the viewpoint of the removing temperature of a blocking agent, the repeating structural unit of Formula (8) is preferred.

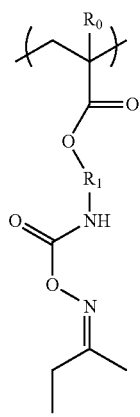
(8)

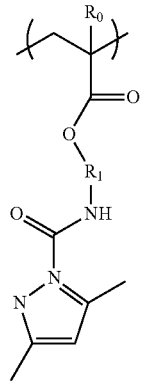
(9)

(In Formula (8) and Formula (9), each $R_0$ is independently a hydrogen atom or a methyl group and each $R_1$ is independently a single bond or a $C_{1-5}$ alkylene group. $R_0$ is preferably a methyl group and $R_1$ is preferably an ethylene group.)

The component (A) may be a copolymer having at least one of three repeating structural units of Formula (3), Formula (4), and Formula (5).

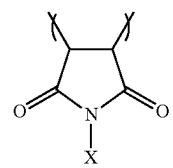
(3)

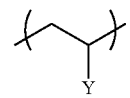
(4)

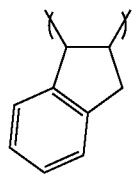
(5)

(In Formula (3), X is a $C_{1-5}$ alkyl group, a $C_{5-6}$ cycloalkyl group, a phenyl group, or a benzyl group. In the alkyl group, the cycloalkyl group, the phenyl group, and the benzyl group, some or all hydrogen atoms are optionally substituted by a halogen atom, a carboxy group, a hydroxy group, an amino group, or a nitro group.

In Formula (4), Y is a phenyl group, a naphthyl group, an anthracenyl group, a biphenylyl group, or a $C_{1-8}$ alkoxy group. In the phenyl group, the naphthyl group, the anthracenyl group, and the biphenylyl group, some or all hydrogen atoms are optionally substituted by a $C_{1-10}$ alkyl group, a halogen atom, a carboxy group, a hydroxy group, an amino group, or a nitro group.)

The copolymer of the component (A) contains the repeating structural unit of Formula (1) in an amount of 10% by mol to 90% by mol and preferably 20% by mol to 70% by mol. The copolymer contains the repeating structural unit of Formula (2) in an amount of 10% by mol to 90% by mol and preferably 20% by mol to 70% by mol. A copolymer of the component (A) further including the repeating structural units of Formula (3) and/or Formula (4) and/or Formula (5) contains the repeating structural units in an amount of 10% by mol to 90% by mol and preferably 20% by mol to 70% by mol.

The copolymer typically has a weight average molecular weight of 1,000 to 50,000 and preferably 1,500 to 30,000. The weight average molecular weight is a value measured by gel permeation chromatography (GPC) using polystyrene as a standard sample.

The photosensitive resin composition for microlenses of the present invention typically contains the component (A) in an amount of 1 to 99% by mass and preferably 10 to 95% by mass based on the solid content of the photosensitive resin composition for microlenses.

In the present invention, the component (A) can be obtained by any method and commonly obtained by polymerization reaction of a monomer mixture containing monomer species used for obtaining the copolymer in a polymerization solvent typically at a temperature of 50 to 110° C.

<Component (B)>

The photosensitizer of the component (B) in the present invention may be any compound usable as a photosensitizing component and is preferably a 1,2-naphthoquinone diazide compound.

A usable example of the 1,2-naphthoquinone diazide compound is a compound that has a hydroxy group and in which 10 to 100% by mol and preferably 20 to 95% by mol of the hydroxy group is esterified with 1,2-naphthoquinone diazide sulfonic acid.

Examples of the compound having a hydroxy group include phenolic compounds such as phenol, o-cresol, m-cresol, p-cresol, hydroquinone, resorcinol, catechol, methyl gallate, ethyl gallate, 1,3,3-tris(4-hydroxyphenyl)butane, 4,4'-isopropylidene diphenol, 1,1-bis(4-hydroxyphenyl)cyclohexane, 4,4'-dihydroxydiphenylsulfone, 4,4'-(hexafluoroisopropylidene)diphenol, 4,4',4''-trishydroxyphenylethane, 1,1,1-trishydroxyphenylethane, 4,4'-[1-[4-[1-(4-hydroxyphenyl)-1-methylethyl]phenyl]ethylidene]bisphenol, 2,4-dihydroxybenzophenone, 2,3,4-trihydroxybenzophenone, 2,2',4,4'-tetrahydroxybenzophenone, 2,3,4,4'-tetrahydroxybenzophenone, and 2,2',3,4,4'-pentahydroxybenzophenone; and aliphatic alcohols such as ethanol, 2-propanol, 4-butanol, cyclohexanol, ethylene glycol, propylene glycol, diethylene glycol, dipropylene glycol, 2-methoxyethanol, 2-butoxyethanol, 2-methoxypropanol, 2-butoxypropanol, ethyl lactate, and butyl lactate.

These photosensitizers may be used singly or in combination of two or more of them.

The photosensitive resin composition for microlenses of the present invention typically contains the component (B) in an amount of 1 to 50% by mass based on the solid content of the photosensitive resin composition for microlenses.

The photosensitive resin composition for microlenses of the present invention may include a cross-linking agent as a component (C). The cross-linking agent of the component (C) in the present invention is a compound forming bonds to the compounded compositions of a resin, a photo sensitizer, and the like or the molecules of other cross-linking agents by the action of heat or acid. Examples of the cross-linking agent include a polyfunctional(meth)acrylate compound, an epoxy compound, a hydroxymethyl group-substituted phenol compound, and a compound having an alkoxyalkylated amino group.

These cross-linking agents may be used singly or in combination of two or more of them.

Examples of the polyfunctional(meth)acrylate compound include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl)isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, and bis(2-hydroxyethyl)isocyanurate di(meth)acrylate.

A usable example of the epoxy compound is a compound of General Formula (10).

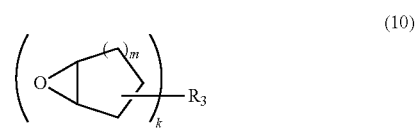

(In Formula (10), k is an integer of 2 to 10, m is an integer of 0 to 4, and $R_3$ is a k-valent organic group.)

Specific example of the compound of Formula (10) in which m is 2 and that has a cyclohexene oxide structure include, but are not limited to, compounds of Formula (11) and Formula (12) and commercial products described below.

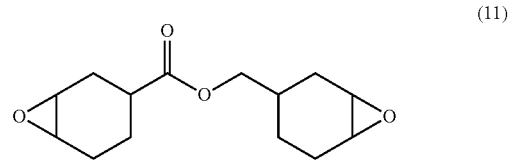

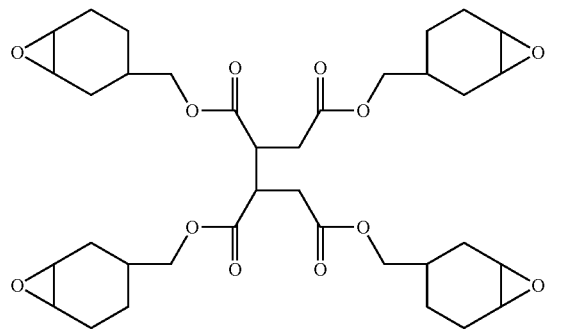

Examples of the commercial product include Epoleads (registered trademark) GT-401, GT-403, GT-301, and GT-302 and Celloxides (registered trademark) 2021 and 3000 (manufactured by Daicel Chemical Industries, Ltd.).

Another usable example of the epoxy compound is a compound of

(In Formula (13), k is an integer of 2 to 10 and $R_4$ is a k-valent organic group.)

Specific examples of the compound having the oxirane structure of Formula (13) include, but are not limited to, commercial products described below. Examples of an alicyclic epoxy resin include Denacol (registered trademark) EX-252 (manufactured by Nagase ChemteX Corporation), EPICLON (registered trademark) 200 and 400 (manufactured by DIC Corporation), and jER (registered trademark) 871 and 872 (manufactured by Mitsubishi Chemical Corporation). Examples of a bisphenol A epoxy resin include jER (registered trademark) 828, 834, 1001, and 1004 (manufactured by Mitsubishi Chemical Corporation), and EPICLON (registered trademark) 850, 860, and 4055 (manufactured by DIC Corporation). Examples of a bisphenol F epoxy resin include jER (registered trademark) 807 (manufactured by Mitsubishi Chemical Corporation) and EPICLON (registered trademark) 830 (manufactured by DIC Corporation). Examples of a phenol novolac epoxy resin include EPICLON (registered trademark) N-740, N-770, and N-775 (manufactured by DIC Corporation) and jER (registered trademark) 152 and 154 (manufactured by Mitsubishi Chemical Corporation). Examples of a cresol novolac epoxy resin include EPICLON (registered trademark) N-660, N-665, N-670, N-673, N-680, N-695, N-665-EXP, and N-672-EXP (manufactured by DIC Corporation). Examples of a glycidylamine epoxy resin include EPICLON (registered trademark) 430 and 430-L (manufactured by DIC Corporation), TETRAD (registered trademark)-C, TETRAD (registered trademark)-X (manufactured by Mitsubishi Gas Chemical Company), jER (registered trademark) 604 and 630 (manufactured by Mitsubishi Chemical Corporation), SUMI-EPDXY (registered trademark) ELM120, ELM100, ELM434, and ELM434HV (manufactured by Sumitomo Chemical Co., Ltd.), and EPOTOHTO (registered trademark) YH-434 and YH-434 L (manufactured by Tohto Kasei Co., Ltd.).

Among them, from the viewpoint of process resistance such as heat resistance, solvent resistance, and long-term baking resistance and transparency, the compounds of Formula (11) and Formula (12), Epolead (registered trademark) GT-401, GT-403, GT-301, and GT-302, and Celloxide (registered trademark) 2021 and 3000, which have a cyclohexene oxide structure, are preferred as the component (C).

Examples of the hydroxymethyl group-substituted phenol compound include 2-hydroxymethyl-4,6-dimethylphenol, 1,3,5-trihydroxymethylbenzene, and 3,5-dihydroxymethyl-4-methoxytoluene[2,6-bis(hydroxymethyl)-p-cresol].

Examples of the compound having an alkoxyalkylated amino group include a nitrogen-containing compound having a plurality of active methylol groups in a molecule, such as (poly)methylolated melamine, (poly)methylolated glycoluril, (poly)methylolated benzoguanamine, and (poly)methylolated urea, in which at least one hydrogen atom of hydroxy groups of the methylol groups is substituted by an alkyl group such as a methyl group and a butyl group.

The compound having an alkoxyalkylated amino group may be a mixture including a plurality of substituted compounds. The mixture may contain some oligomer components formed by self-condensation and such a mixture can also be used. More specific examples include CYMEL series products such as hexamethoxymethylmelamine (manufactured by Nihon Cytec Industries Inc., CYMEL (registered trademark) 303), tetrabutoxymethylglycoluril (manufactured by Nihon Cytec Industries Inc., CYMEL (registered trademark) 1170), and tetramethoxymethylbenzoguanamine (manufactured by Nihon Cytec Industries Inc., CYMEL (registered trademark) 1123); and Nikalac series products such as methylated melamine resins (manufactured by SANWA Chemical Co., Ltd., Nikalac (registered trademark) MW-30HM, MW-390, MW-100LM, and MX-750LM) and methylated urea resins (manufactured by SANWA Chemical Co., Ltd., Nikalac (registered trademark) MX-270, MX-280, and MX-290).

The photosensitive resin composition for microlenses of the present invention typically contains the component (C) in an amount of 1 to 50% by mass based on the solid content of the photosensitive resin composition for microlenses.

The photosensitive resin composition for microlenses of the present invention may be prepared by any method. Examples of the preparation method include a method in which a copolymer as the component (A) is dissolved in a solvent; and to the solution, a photosensitizer as the component (B) and, if necessary, a cross-linking agent as the component (C) are mixed at a predetermined ratio to yield a homogeneous solution. Moreover, examples include a method in which other additives are further added and mixed, as necessary, at an appropriate step in the preparation method.

The solvent is not specifically limited as long as the component (A), the component (B), and the component (C) can be dissolved.

Examples of such a solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, propylene glycol monobutyl ether, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl acetate, butyl acetate, ethyl lactate, butyl lactate, 2-heptanone, and γ-butyrolactone.

These solvents may be used singly or in combination of two or more of them.

Among these solvents, for the improvement of leveling properties of coating, propylene glycol monomethyl ether, propylene glycol monomethyl ether acetate, 2-heptanone, ethyl lactate, butyl lactate, and cyclohexanone are preferred.

The photosensitive resin composition for microlenses of the present invention may include a surfactant in order to improve coating properties.

Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenol ether and polyoxyethylene nonylphenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants including EFTOP (registered trademark) EF301, EF303, and EF352 (manufactured by Mitsubishi Materials Electronic Chemicals Co., Ltd. (formerly Jemco)), MEGAFAC (registered trademark) F171, F173, and R30 (manufactured by DIC Corporation), Fluorads FC 430 and FC431 (manufactured by Sumitomo 3M), Asahiguard (registered trademark) AG710, Surflon (registered trademark) S-382, SC101, SC102, SC103, SC104, SC105, and SC106 (manufactured by Asahi Glass Co., Ltd.), and FTERGENT series products such as FTX-206D, FTX-212D, FTX-218, FTX-220D, FTX-230D, FTX-240D, FTX-212P, FTX-220P, FTX-228P, and FTX-240G (manufactured by Neos Company Ltd.); and an organosiloxane polymer KP 341 (manufactured by Shin-Etsu Chemical Co., Ltd.).

The surfactants may be used singly or in combination of two or more of them.

When the surfactant is used, the photosensitive resin composition for microlenses of the present invention contains the surfactant in an amount of 3% by mass or less, preferably 1% by mass or less, and more preferably 0.5% by mass or less, based on the solid content of the photosensitive resin composition for microlenses.

The photosensitive resin composition for microlenses of the present invention can include additives such as a curing auxiliary agent, an ultraviolet absorber, a sensitizer, a plasticizer, an antioxidant, and a bonding auxiliary agent, as necessary, as long as the advantageous effects of the invention is not impaired.

The use of the photosensitive resin composition for microlenses of the present invention will be described below.

Onto a substrate (for example, a semiconductor substrate such as a silicon coated with a silicon oxide film, a semiconductor substrate such as a silicon coated with a silicon nitride film or a silicon oxynitride film, a silicon nitride substrate, a quartz substrate, a glass substrate (including non-alkali glass, low-alkali glass, and crystallized glass), and a glass substrate with an ITO film), the photosensitive resin composition for microlenses of the present invention is applied by an appropriate coating means such as a spinner and a coater, and then is pre-baked by a heating means such as a hot plate to form a coating film.

The condition for the pre-bake is appropriately selected from a baking temperature of 80 to 250° C. and a baking time of 0.3 to 60 minutes and is preferably a baking temperature of 80 to 150° C. and a baking time of 0.5 to 5 minutes.

A film formed of the photosensitive resin composition for microlenses of the present invention has a film thickness of 0.005 to 3.0 µM and preferably 0.01 to 1.0 µm.

Next, on the film obtained above, exposure is performed through a mask (reticle) for forming a predetermined pattern. For the exposure, g-rays, i-rays, a KrF excimer laser, or the like may be employed. After the exposure, post exposure bake is performed, as necessary. The condition for the post exposure bake is appropriately selected from a heating temperature of 80 to 150° C. and a heating time of 0.3 to 60 minutes. Then, the film is developed with an alkaline developer.

Examples of the alkaline developer include alkaline aqueous solutions including an aqueous solution of an alkali metal hydroxide such as potassium hydroxide and sodium hydroxide; an aqueous solution of a quaternary ammonium hydroxide such as tetramethylammonium hydroxide, tetraethylammonium hydroxide, and choline; and an aqueous solution of an amine such as ethanolamine, propylamine, and ethylenediamine.

These developers may further contain a surfactant.

The condition for the development is appropriately selected from a development temperature of 5 to 50° C. and a development time of 10 to 300 seconds. The film formed of the photosensitive resin composition for microlenses of the present invention can be readily developed at room temperature with an aqueous tetramethylammonium hydroxide solution. After the development, the film is rinsed with ultrapure water, for example.

The whole area of the substrate is further exposed using rays, i-rays, a KrF excimer laser or the like. Then, the substrate is subjected to post-bake (reflow) using a heating means such as a hot plate. The condition for the post-bake is appropriately selected from a baking temperature of 100 to 250° C. and a baking time of 0.5 to 60 minutes.

EXAMPLES

The present invention will now be described in further, detail based on examples and comparative examples but the present invention is not limited to these examples.

[Measurement of Weight Average Molecular Weight of Polymer Obtained in Synthesis Examples Below]
Apparatus: GPC system manufactured by JASCO Corporation
Column: Shodex [registered trademark] KL-804L and 803L
Column oven: 40° C.
Flow rate: 1 mL/min
Eluent: tetrahydrofuran Synthesis of Polymer Synthesis Example 1

In 144.5 g of propylene glycol monomethyl ether, 15.0 g of maleimide, 22.0 g of glycidyl methacrylate, 23.7 g of N-cyclohexylmaleimide, and 1.2 g of dimethyl 2,2'-azobis(isobutyrate) were dissolved, and then the solution was added dropwise over 3 hours into a flask in which 41.3 g of propylene glycol monomethyl ether was kept at 80° C. After the completion of the dropwise addition, the whole was reacted for 12 hours. The reaction solution was cooled to room temperature, then pouring the solution into a diethyl ether solvent allowed a polymer to be reprecipitated, and the precipitate was dried under reduced pressure to yield a polymer (copolymer) having three repeating structural units of Formula (14).

The obtained polymer had a weight average molecular weight Mw of 4,900 (in terms of polystyrene).

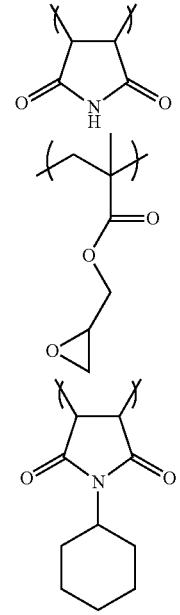

(14)

Synthesis Example 2

In 29.8 g of propylene glycol monomethyl ether, 2.0 g of maleimide, 5.86 g of glycidyl methacrylate, 4.29 g of styrene, and 0.6 g of dimethyl 2,2'-azobis(isobutyrate) were dissolved, and then the solution was added dropwise over 3 hours into a flask in which 8.5 g of propylene glycol monomethyl ether was kept at 80° C. After the completion of the dropwise addition, the whole was reacted for 12 hours. The reaction solution was cooled to room temperature, then pouring the solution into a diethyl ether solvent allowed a polymer to be reprecipitated, and the precipitate was dried under reduced pressure to yield a polymer (copolymer) having three repeating structural units of Formula (15).

The obtained polymer had a weight average molecular weight Mw of 6,000 (in terms of polystyrene).

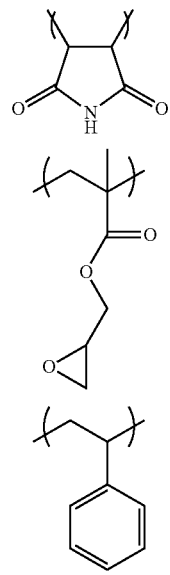

(15)

Synthesis Example 3

In 34.7 g of propylene glycol monomethyl ether, 3.7 g of maleimide, 7.5 g of 3,4-epoxycyclohexylmethyl methacrylate (Cyclomer (registered trademark) M100 (manufactured by Daicel Chemical Industries, Ltd.)), 3.4 g of N-cyclohexylmaleimide, and 0.3 g of dimethyl 2,2'-azobis(isobutyrate) were dissolved, and then the solution was added dropwise over 3 hours into a flask in which 9.9 g of propylene glycol monomethyl ether was kept at 100° C. After the completion of the dropwise addition, the whole was reacted for 12 hours. The reaction solution was cooled to room temperature, then pouring the solution into a diethyl ether solvent allowed a polymer to be reprecipitated, and the precipitate was dried under reduced pressure to yield a polymer (copolymer) having three repeating structural units of Formula (16).

The obtained polymer had a weight average molecular weight Mw of 3,500 (in terms of polystyrene).

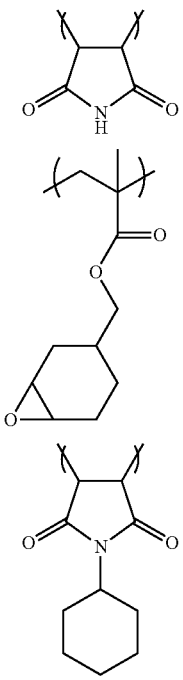

(16)

Synthesis Example 4

In 92.5 g of propylene glycol monomethyl ether, 12.0 g of maleimide, 8.4 g of glycidyl methacrylate, 17.2 g of 2-vinylnaphthalene, and 2.0 g of dimethyl 2,2'-azobis(isobutyrate) were dissolved, and then the solution was added dropwise over 3 hours into a flask in which 26.4 g of propylene glycol monomethyl ether was kept at 80° C. After the completion of the dropwise addition, the whole was reacted for 12 hours. The reaction solution was cooled to room temperature, then pouring the solution into a methanol solvent allowed a polymer to be reprecipitated, and the precipitate was dried under reduced pressure to yield a polymer (copolymer) having three repeating structural units of Formula (17).

The obtained polymer had a weight average molecular weight Mw of 9,500 (in terms of polystyrene).

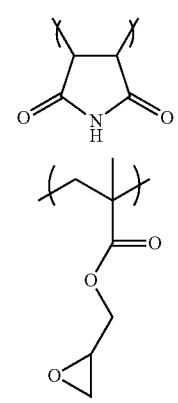

(17)

-continued

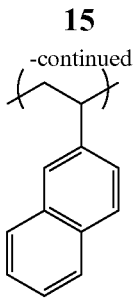

Synthesis Example 5

In 78.4 g of propylene glycol monomethyl ether, 10.0 g of maleimide, 7.0 g of glycidyl methacrylate, 14.9 g of 4-tert-butylstyrene, and 1.7 g of dimethyl 2,2'-azobis(isobutyrate) were dissolved, and then the solution was added dropwise over 3 hours into a flask in which 22.4 g of propylene glycol monomethyl ether was kept at 80° C. After the completion of the dropwise addition, the whole was reacted for 12 hours. The reaction solution was cooled to room temperature, then pouring the solution into pure water allowed a polymer to be reprecipitated, and the precipitate was dried under reduced pressure to yield a polymer (copolymer) having three repeating structural units of Formula (18).

The obtained polymer had a weight average molecular weight Mw of 15,500 (in terms of polystyrene).

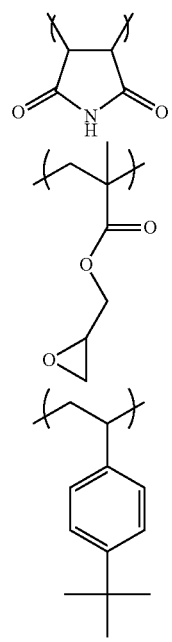

(18)

Synthesis Example 6

In 30.4 g of propylene glycol monomethyl ether, 3.0 g of maleimide, 5.6 g of 2-(O-[1'-methylpropylideneamino]carboxyamino)ethyl methacrylate (Karenz MOI-BM (registered trademark) manufactured by Showa Denko K. K.), 4.2 g of N-cyclohexylmaleimide, and 0.3 g of dimethyl 2,2'-azobis (isobutyrate) were dissolved, and the solution was added dropwise over 3 hours into a flask in which 8.7 g of propylene glycol monomethyl ether was kept at 80° C. After the completion of the dropwise addition, the whole was reacted for 12 hours. The reaction solution was cooled to room temperature, then pouring the solution into a diethyl ether solvent allowed a polymer to be reprecipitated, and the precipitate was dried under reduced pressure to yield a polymer (copolymer) having three repeating structural units of Formula (19).

The obtained polymer had a weight average molecular weight Mw of 5,400 (in terms of polystyrene).

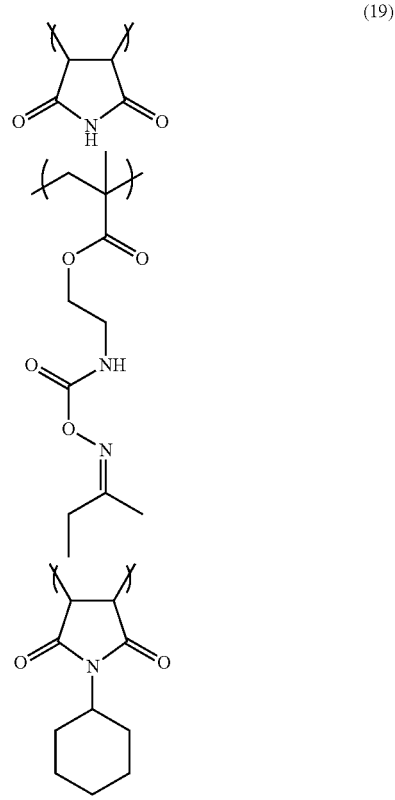

(19)

Preparation of Photosensitive Resin Composition Solution

Example 1

In 28.6 g of propylene glycol monomethyl ether and 13.1 g of ethyl lactate, 5 g of the polymer as the component (A) obtained in Synthesis Example 1, 1.5 g of P-200 (manufactured by Toyo Gosei Co., Ltd.) as a photosensitizer of the component (B), and 0.02 g of MEGAFAC R-30 (manufactured by DIC Corporation) as a surfactant were dissolved and thus a solution was prepared. Then, the solution was filtered using a polyethylene microfilter having a pore size of 0.20 μm to yield a photosensitive resin composition.

Example 2

A photosensitive resin composition was prepared in the same condition as that in Example 1 except that 5 g of the polymer obtained in Synthesis Example 2 was used as the component (A).

Example 3

A photosensitive resin composition was prepared in the same condition as that in Example 1 except that 5 g of the polymer obtained in Synthesis Example 3 was used as the component (A).

Example 4

A photosensitive resin composition was prepared in the same condition as that in Example 1 except that 5 g of the polymer obtained in Synthesis Example 6 was used as the component (A).

Example 5

In 34.1 g of propylene glycol monomethyl ether and 14.6 g of ethyl lactate, 5 g of the polymer as the component (A) obtained in Synthesis Example 1, 1.5 g of P-200 (manufactured by Toyo Gosei Co., Ltd.) as a photosensitizer of the component (B), 0.75 g of Celloxide (registered trademark) 2021P (manufactured by Daicel Chemical Industries, Ltd.) as a cross-linking agent of the component (C), and 0.02 g of MEGAFAC (registered trademark) R-30 (manufactured by DIC Corporation) as a surfactant were dissolved and thus a solution was prepared. Then, the solution was filtered using a polyethylene microfilter having a pore size of 0.20 μm to yield a photosensitive resin composition.

Example 6

A photosensitive resin composition was prepared in the same condition as that in Example 5 except that 5 g of the polymer obtained in Synthesis Example 4 was used as the component (A).

Example 7

A photosensitive resin composition was prepared in the same condition as that in Example 5 except that 5 g of the polymer obtained in Synthesis Example 5 was used as the component (A).

Comparative Example 1

In 46.0 g of propylene glycol monomethyl ether and 19.7 g of ethyl lactate, 9 g of poly(4-vinylphenol) (manufactured by Sigma-Aldrich Japan, a weight average molecular weight Mw of 20,000) having a repeating structural unit of Formula (20), 2.7 g of P-200 (manufactured by Toyo Gosei Co., Ltd.) as a photosensitizer, 1.4 g of CYMEL (registered trademark) 303 (Nihon Cytec Industries Inc.) as a cross-linking agent, and 0.03 g of MEGAFAC (registered trademark) R-30 (manufactured by DIC Corporation) as a surfactant were dissolved and thus a solution was prepared. Then, the solution was filtered using a polyethylene microfilter having a pore size of 0.10 μm to yield a photosensitive resin composition.

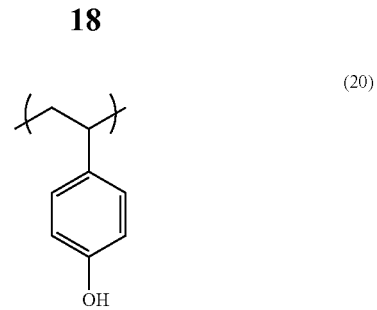

(20)

[Measurement of Transmittance]

Each photosensitive resin composition prepared in Example 1 to Example 7 and Comparative Example 1 was applied onto a quartz substrate using a spin coater and was pre-baked on a hot plate at 100° C. for 3 minutes. Next, the whole area of each substrate was irradiated with ultraviolet light having an irradiation intensity of 500 mJ/cm$^2$ at 365 nm with an ultraviolet irradiation apparatus PLA-501 (F) (manufactured by Canon Inc.) (photobleaching). Then, the substrate was post-baked on a hot plate at 200° C. for 5 minutes to yield a film having a film thickness of 600 nm. The transmittance at a wavelength of 400 nm of the film was determined using a ultraviolet-visible spectrophotometer UV-2550 (manufactured by Shimadzu Corporation). The film was further heated at 260° C. for 5 minutes, and then the transmittance at a wavelength of 400 nm was determined. Table 1 shows the evaluation results.

[Table 1]

TABLE 1

| | Transmittance % (400 nm) | |
|---|---|---|
| | 200° C. | 260° C. |
| Example 1 | 98 | 98 |
| Example 2 | 99 | 99 |
| Example 3 | 99 | 98 |
| Example 4 | 96 | 94 |
| Example 5 | 97 | 97 |
| Example 6 | 99 | 98 |
| Example 7 | 99 | 98 |
| Comparative Example 1 | 95 | ≦78 |

The results in Table 1 reveal that each film formed of the photosensitive resin composition for microlenses of the present invention had high heat resistance and was hardly colored even after the heating at 260° C. In contrast, the film formed of the resin composition prepared in Comparative Example 1 had a film transmittance of 95% after the post-bake at 200° C. for 5 minutes but had a reduced film transmittance of 78% or less after the additional heating at 260° C. for 5 minutes. A film transmittance is commonly required to be 90% or more and the transmittance is desired to hardly change even after heating. The result from Comparative Example 1 failed to satisfy both the requirements.

[Patterning Test]

Each photosensitive resin composition prepared in Example 1 to Example 7 was applied onto a silicon wafer using a spin coater and was pre-baked on a hot plate at 100° C. for 90 seconds to yield a photosensitive resin film having a film thickness of 600 nm. Next, the film was exposed through a mask using an i-ray stepper NSR-2205i12D (NA=0.63) (manufactured by NIKON CORPORATION). Then, the film was subjected to post exposure bake (PEB) on a hot plate at 100° C. for 90 seconds, and was developed for 60 seconds with an aqueous tetramethylammonium hydroxide (TMAH) solution (0.4% by mass for the films of the photosensitive resin compositions prepared in Example 1 to Example 5, and 1.0% by mass for those of the photosensitive resin compositions prepared in Examples 6 and 7 and Comparative Example 1). The film was rinsed with ultrapure water for 20 seconds and then was dried to yield a dot pattern having a size of 1.4 μm×1.4 μm. The whole area of the film was further irradiated with i-rays at 500 mJ/cm² using the i-ray stepper (photobleaching). The film was subjected to main bake on a hot plate (first, the film was baked at a temperature of 100° C. to 180° C. for 5 minutes; next, the temperature was raised to 180° C. to 200° C.; and then the film was baked for 5 minutes). The film was further heated at 260° C. for 5 minutes. Each pattern was observed under a scanning electron microscope S-4800 (manufactured by Hitachi High-Technologies Corporation) after the development, rinse, and drying, after the main bake, and after the heating at 260° C. It was ascertained that each photosensitive resin composition prepared in Example 1 to Example 7 could produce a semispherical lens after the main bake and the lens did not deform even after the following bake at 260° C.

[Elution Test into Photoresist Solvent]

Each photosensitive resin composition prepared in Example 1 to Example 7 was applied onto a silicon wafer using a spin coater and was pre-baked on a hot plate at 100° C. for 3 minutes. Next, the whole area of each substrate was irradiated with ultraviolet light having an irradiation intensity of 500 mJ/cm² at 365 nm with an ultraviolet irradiation apparatus PLA-501 (F) (manufactured by Canon Inc.) (photobleaching). Then, the substrate was post-baked on a hot plate at 200° C. for 5 minutes to yield a film having a film thickness of 600 nm. These films were immersed in each of acetone, N-methylpyrrolidone, 2-propanol, and 2-heptanone at 23° C. for 10 minutes. It was ascertained that each film formed of the photosensitive resin compositions prepared in Example 1 to Example 7 had a film thickness change of 5% or less before and after the immersion.

The invention claimed is:

1. A photosensitive resin composition for a microlens, comprising:
   a component (A);
   a component (B), which is a photosensitizer; and
   a solvent;
wherein:
   the component (A) is a copolymer comprising:
      a maleimide structural unit of Formula (1);
      a repeating structural unit of Formula (2); and
      at least one repeating structural unit represented by Formula (3) and Formula (5), wherein the copolymer does not comprise a repeating structural unit of Formula (4):

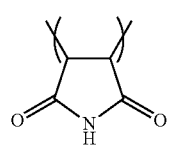
(1)

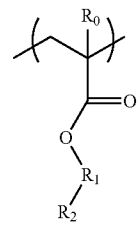
(2)

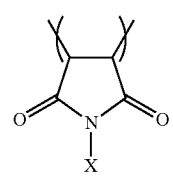
(3)

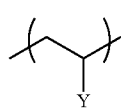
(4)

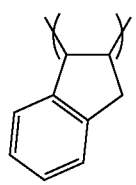
(5)

where:
   each $R_0$ is independently a hydrogen atom or a methyl group;
   each $R_1$ is independently a single bond or a $C_1$-$C_5$ alkylene group;
   $R_2$ is a thermally cross-linkable monovalent organic group comprising a blocked isocyanate group;
   X is a $C_1$-$C_5$ alkyl group, a $C_5$-$C_6$ cycloalkyl group, a phenyl group, or a benzyl group; and in the alkyl group, the cycloalkyl group, the phenyl group, and the benzyl group, some or all hydrogen atoms are optionally substituted by a halogen atom, a carboxy group, a hydroxyl group, an amino group, or a nitro group; and
   Y is a biphenylyl group or a $C_1$-$C_8$ alkoxy group; and in the biphenylyl group, some or all hydrogen atoms are optionally substituted by a $C_1$-$C_{10}$ alkyl group, a halogen atom, a carboxy group, a hydroxyl group, an amino group, or a nitro group.

2. The photosensitive resin composition according to claim 1, wherein the repeating structural unit of Formula (2) is a repeating structural unit of Formula (8) or Formula (9):

(8)

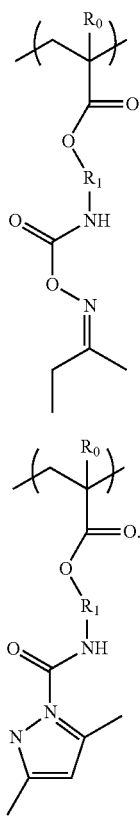

(9)

3. A photosensitive resin composition for a microlens, comprising:
   a component (A);
   a component (B), which is a photosensitizer; and
   a solvent;
wherein:
   the component (A) is a copolymer comprising;
      a maleimide structural unit of Formula (1);
      a repeating structural unit of Formula (2); and
      at least one repeating structural unit represented by Formula (3) and Formula (5), wherein the copolymer does not comprise a repeating structural unit of Formula (4):

(1)

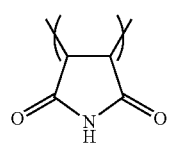

(2)

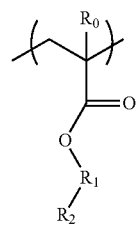

(3)

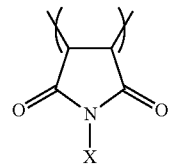

(4)

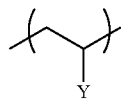

(5)

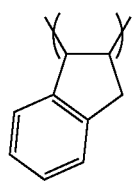

where:
   each $R_0$ is independently a hydrogen atom or a methyl group;
   each $R_1$ is independently a single bond or a $C_1$-$C_5$ alkylene group;
   $R_2$ is a thermally cross-linkable monovalent organic group comprising an epoxy group or a blocked isocyanate group;
   X is a $C_1$-$C_5$ alkyl group, a $C_5$-$C_6$ cycloalkyl group, a phenyl group, or a benzyl group; and in the alkyl group, the cycloalkyl group, the phenyl group, and the benzyl group, some or all hydrogen atoms are optionally substituted by a halogen atom, a carboxy group, a hydroxy group, an amino group, or a nitro group; and
   Y is a phenyl group, a naphthyl group, an anthracenyl group, a biphenylyl group, or a $C_1$-$C_8$ alkoxy group; and in the phenyl group, the naphthyl group, the anthracenyl group, and the biphenylyl group, some or all hydrogen atoms are optionally substituted by a $C_1$-$C_{10}$ alkyl group, a halogen atom, a carboxy group, a hydroxy group, an amino group, or a nitro group.

4. The photosensitive resin composition according to claim 1, further comprises a cross-linking agent as a component (C).

5. The photosensitive resin composition according to claim 1, wherein the copolymer has a weight average molecular weight of 1,000 to 50,000.

6. A cured film obtained from the photosensitive resin composition as claimed in claim 1.

7. A microlens produced from the photosensitive resin composition as claimed in claim 1.

8. A photosensitive resin composition for a microlens, comprising:
   a component (A);
   a component (B), which is a photosensitizer; and
   a solvent;
wherein:
   the component (A) is a copolymer comprising:
      a maleimide structural unit of Formula (1);

a repeating structural unit of Formula (2); and
at least one repeating structural unit represented by Formula (3) and Formula (5), wherein the copolymer does not comprise a repeating structural unit of Formula (4):

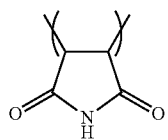
(1)

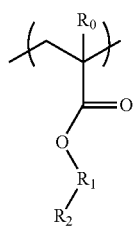
(2)

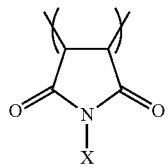
(3)

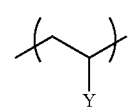
(4)

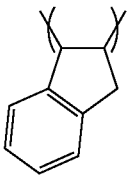
(5)

where;

each $R_0$ is independently a hydrogen atom or a methyl group;

each $R_1$ is independently a single bond or a $C_1$-$C_5$ alkylene group; and $R_2$ is a thermally cross-linkable monovalent organic group comprising an epoxy group or a blocked isocyanate group;

X is a $C_1$-$C_5$ alkyl group, a $C_5$-$C_6$ cycloalkyl group, a phenyl group, or a benzyl group; and in the alkyl group, the cycloalkyl group, the phenyl group, and the benzyl group, some or all hydrogen atoms are optionally substituted by a halogen atom, a carboxy group, a hydroxyl group, an amino group, or a nitro group; and Y is a phenyl group, a naphthyl group, or an anthracenyl group; and in the phenyl group, the naphthyl group, and the anthracenyl group, some or all hydrogen atoms are optionally substituted by a $C_1$-$C_{10}$ alkyl group, a halogen atom, a carboxy group, a hydroxyl group, an amino group, or a nitro group.

\* \* \* \* \*